US006823272B2

(12) United States Patent
Sutton

(10) Patent No.: US 6,823,272 B2
(45) Date of Patent: Nov. 23, 2004

(54) TEST EXECUTIVE SYSTEM WITH PROGRESS WINDOW

(75) Inventor: Christopher K Sutton, Everett, WA (US)

(73) Assignee: Agilent Technologies, Inc., Palo Alto, CA (US)

(*) Notice: Subject to any disclaimer, the term of this patent is extended or adjusted under 35 U.S.C. 154(b) by 620 days.

(21) Appl. No.: 10/000,603

(22) Filed: Oct. 23, 2001

(65) Prior Publication Data
US 2003/0079162 A1 Apr. 24, 2003

(51) Int. Cl.$^7$ .............................................. G06F 19/00
(52) U.S. Cl. ........................... 702/58; 702/67; 702/84; 345/821; 700/121
(58) Field of Search .............................. 702/58, 67, 84, 702/182, 68, 117, 118, 81, 82, 83; 345/804, 788, 821; 700/121

(56) References Cited

U.S. PATENT DOCUMENTS

| | | | |
|---|---|---|---|
| 5,390,131 A | * 2/1995 | Rohrbaugh et al. | ............. 716/4 |
| 5,726,920 A | * 3/1998 | Chen et al. | ................. 702/108 |
| 5,761,064 A | * 6/1998 | La et al. | ...................... 700/110 |
| 5,838,951 A | * 11/1998 | Song | ........................... 716/19 |
| 5,841,893 A | * 11/1998 | Ishikawa et al. | ............ 382/145 |
| 5,991,699 A | * 11/1999 | Kulkarni et al. | .............. 702/83 |
| 6,033,316 A | * 3/2000 | Nixon | ........................ 473/131 |
| 6,036,345 A | * 3/2000 | Jannette et al. | ............... 700/97 |
| 6,038,588 A | * 3/2000 | Nagarajayya et al. | ....... 718/102 |
| 6,091,997 A | * 7/2000 | Flamme et al. | ............... 700/83 |
| 6,138,252 A | * 10/2000 | Whitten et al. | ............... 714/46 |
| 6,418,389 B2 | * 7/2002 | Peter et al. | .................. 702/108 |
| 6,446,021 B1 | * 9/2002 | Schaeffer | ..................... 702/118 |
| 6,453,435 B1 | * 9/2002 | Limon et al. | ............... 714/724 |
| 6,473,707 B1 | * 10/2002 | Grey | .......................... 702/123 |
| 6,577,981 B1 | * 6/2003 | Grey et al. | .................. 702/119 |
| 6,590,587 B1 | * 7/2003 | Wichelman et al. | ........ 345/736 |
| 6,597,381 B1 | * 7/2003 | Eskridge et al. | ............ 345/804 |
| 6,639,417 B2 | * 10/2003 | Takao | ......................... 324/765 |
| 6,639,687 B1 | * 10/2003 | Neilsen | ..................... 358/1.14 |
| 6,745,140 B2 | * 6/2004 | Sutton | ......................... 702/67 |
| 2001/0019328 A1 | * 9/2001 | Schwuttke et al. | ......... 345/440 |
| 2003/0033105 A1 | * 2/2003 | Yutkowitz | ................... 702/105 |
| 2003/0233387 A1 | * 12/2003 | Watanabe et al. | ........... 709/100 |
| 2004/0153776 A1 | * 8/2004 | Rhea et al. | ................... 714/25 |

FOREIGN PATENT DOCUMENTS

CA 2 236 063 A 10/1999

OTHER PUBLICATIONS

National Instruments, "TestStand—A Complete Test Executive Environment," National Instruments, p. 55–60 (Mar., 2000).
Czapski, Joseph, "Useful Feathures of Automated Test Systems in the R&D Laboratory", Proceedings of the Autotestcon 2000, IEEE, Sep. 18–21, 2000, pp. 601–613, XPO02256433.

* cited by examiner

Primary Examiner—Patrick J Assouad

(57) ABSTRACT

An electronic test system with a progress window that enables the user to observe in one glance the progress and status of a test. The progress window is preferably comprised of graphical elements representing test results grouped along a progress axis representing the length of the test procedure. Each graphical element is preferably displayed as a bar, with the length of the bar perpendicular to the progress axis representing the value of the result. The specifications limits are represented by lines parallel to the progress axis. A line above the progress axis represents the upper specification limit and a line below the progress axis represents the lower specification limit. The bars are color coded to display the pass, fail and marginal status of the test.

33 Claims, 6 Drawing Sheets

| MARGINAL | PASS | FAIL |

TEST EXECUTIVE SYSTEM WITH PROGRESS WINDOW

BACKGROUND OF THE INVENTION

1. Field of the Invention

The present invention relates to electronic systems for performing automated tests of complex electronic, electromechanical and mechanical equipment and products. More particularly, the present invention relates to an electronic test system with a progress window that enables the user to see in a glance the progress and results of an entire test.

2. Statement of the Problem

Complex electronic, electromechanical and mechanical products and equipment are generally tested using automated test systems. Such tests can include validation tests which run through the various operations that the device under test (DUT) is capable of and records whether each operation was performed properly; environmental tests which expose the DUT to various combinations of temperature, pressure, and humidity, and records the results; production tests, etc. Generally, both the DUT and the systems providing the environmental and other constraints on the DUT are controlled electronically. In the last decade or so, computerized programs which are capable of controlling a variety of automated tests, referred to in the art as "test executive" programs, have been developed.

Test executive programs in the prior art include internal test executive programs developed by Agilent Technologies and TESTSTAND software developed by National Instruments Corporation, which is described as a ready-to-run test executive for organizing, controlling, and executing automated prototype, validation, or production test systems. The prior art Agilent Technologies programs did not use a graphical user interface (GUI), therefore limiting the ability of the program to display large amounts of data in a simple fashion. The TESTSTAND software, while using a GUI, requires the user to scroll through multiple windows to determine the overall progress of a test.

Tests usually are defined by a set of rules or specifications to which the DUT is compared. The rules or specifications generally comprise various inputs defined by electrical and mechanical parameters applied to the DUT, such as voltage, current, specified manipulations of controls and device parts, as well as environmental parameters under which the test is conducted, such as temperature, humidity, pressure, and the time period over which a parameter is applied. Each test will include many combinations of the parameters applied to each element of the DUT, and often will be repeated many times. Each combination of parameters will define a measurement that results in one or more datapoints, which are recorded and compared to numerical or Boolean limits defining the specifications. Thus, as equipment and products become more complex, electronic test programs have become very long and complex, often requiring several days, or even a week or more to run a complete test.

In prior art test systems, the test results are displayed as text on a computer display screen as the test progresses, with the current test conditions and results, or a small portion of the conditions and results just prior to the current time, visible. If the user desires to see results from earlier portions of the test, the user scrolls through a display to extract information on the status of the test. Because of the length and complexity of the test, it is not physically possible to display the entire report of a test on the screen at one time. At any given point in the scrolling, the user has only a partial view of the results, making it difficult for the user to draw conclusions on the overall progress of the test without time consuming and tedious recording and summarizing.

In actual practice, the user almost always will permit the test to run unattended for hours, overnight, or for days, while other work is attended to. Because of the length and complexity of the tests, when the user returns to check on the test, it takes considerable time and effort to review the results to determine the progress of the test. In such cases, it often happens that the time necessary to do a thorough analysis of the results is not available as the test is being run. As a result, much test time is wasted when test results are reviewed after a run is completed, and it is found that certain elements of the test were improperly set up, or the DUT was faulty in some respect that was not recognized during the test.

It would be highly desirable to have a test executive system in which, at any given point in a lengthy test, the overall progress and status of the test could be quickly determined.

SUMMARY OF THE INVENTION

The present invention solves the above and other problems in prior art by allowing the user to see the progress of the entire procedure on a small graphical display called a progress window. The progress window enables the user to evaluate an entire test in a single glance while the test is still running. This allows the user to save time by immediately seeing if the number of failed or false results is unacceptable. The user does not have to search through the whole listing of results to determine if the test is running properly. Tests that are not progressing properly according to a set of rules, or specifications, predetermined by the user are quickly identified.

The electronic test output is displayed through an easy to use graphical user interface (GUI). It is preferably divided into windows containing either icons for controlling the test procedure or windows for displaying the results as text, tables, graphical points or graphical colored bars, and other GUI elements. The user can control the test procedure by accessing the programs represented by the icons and windows with a pointing device such as a mouse, a keyboard, a trackball, a touch pad, a roller ball and a joystick.

The portion of the display containing the progress window is preferably a small portion of the graphical user interface (GUI) where the results are displayed as single graphical elements such as graphical points, graphical bars, graphical sectors or single alphanumeric characters.

The graphical elements are grouped in a manner to display the progress of the test. Preferably, the graphical elements are grouped on this window along a first axis, and the distance of these graphical elements extends along the first axis representing the total length of the whole test procedure.

Preferably, each graphical element is color coded to facilitate rapid distinguishing of the test progress. Preferably, the color coding indicates that the corresponding result is a "pass", i.e., within specification, a "fail", i.e., outside specification, or "marginal", i.e., just barely within specification.

Preferably, each graphical element is a bar extending in a direction perpendicular to the first axis. Preferably, each bar is color coded to indicate if the corresponding result is a "pass", i.e., within specification, a "fail", i.e., outside specification, or "marginal", i.e., just barely within specification. Monitoring the progress window allows the user to check the time left to accomplish the test procedure but, more importantly, it allows the user to check the status of the test; that is, how many of the results are pass, fail or marginal.

The pass/fail criterion is determined by comparing the results to a specification. Preferably, the specification is displayed on the progress window by at least one specification limit. Most preferably, there are two specification limits, which are preferably an upper specification limit and a lower specification limit. Preferably, each specification limit is a line. Preferably, the upper specification limit is a line above and parallel to the first axis. Preferably, the lower specification limit is a line below and parallel to the second axis.

Preferably, the length of each bar is normalized so it is proportional to the ratio of the numerical value of the datapoint and the numerical value of the corresponding specification. A mathematical criterion is applied to determine if the result is within the specification limits, outside the specification limits, or barely inside the specification limits, which criterion determines if the test is pass, fail or marginal. As indicated above, preferably, a color is assigned to the vertical graphical bar, representing the value of the datapoint, depending on its pass, fail or marginal status. This color code is a visual tool helping the user to determine instantly how the test is progressing. Preferably, the lines representing the upper and lower specification limits are placed at a unit (1) distance above and below the first axis, respectively. Thus, if the data point is within specification, its length is such that it is within the area defined by the specification limit lines, and if the data point is outside specification, its length extends beyond the corresponding specification limit line, and if the datapoint is marginal, its length is equal to or close to the corresponding specification limit line.

The present invention not only provides an electronic test program that displays the overall output in a form that can be observed in a glance, but also displays the output in a form which permits the user to quickly check individual results. Other features, objects and advantages of the invention will become apparent from the following description when read in conjunction with the accompanying drawings.

DETAILED DESCRIPTION OF THE PREFERRED EMBODIMENT

Figure 1:
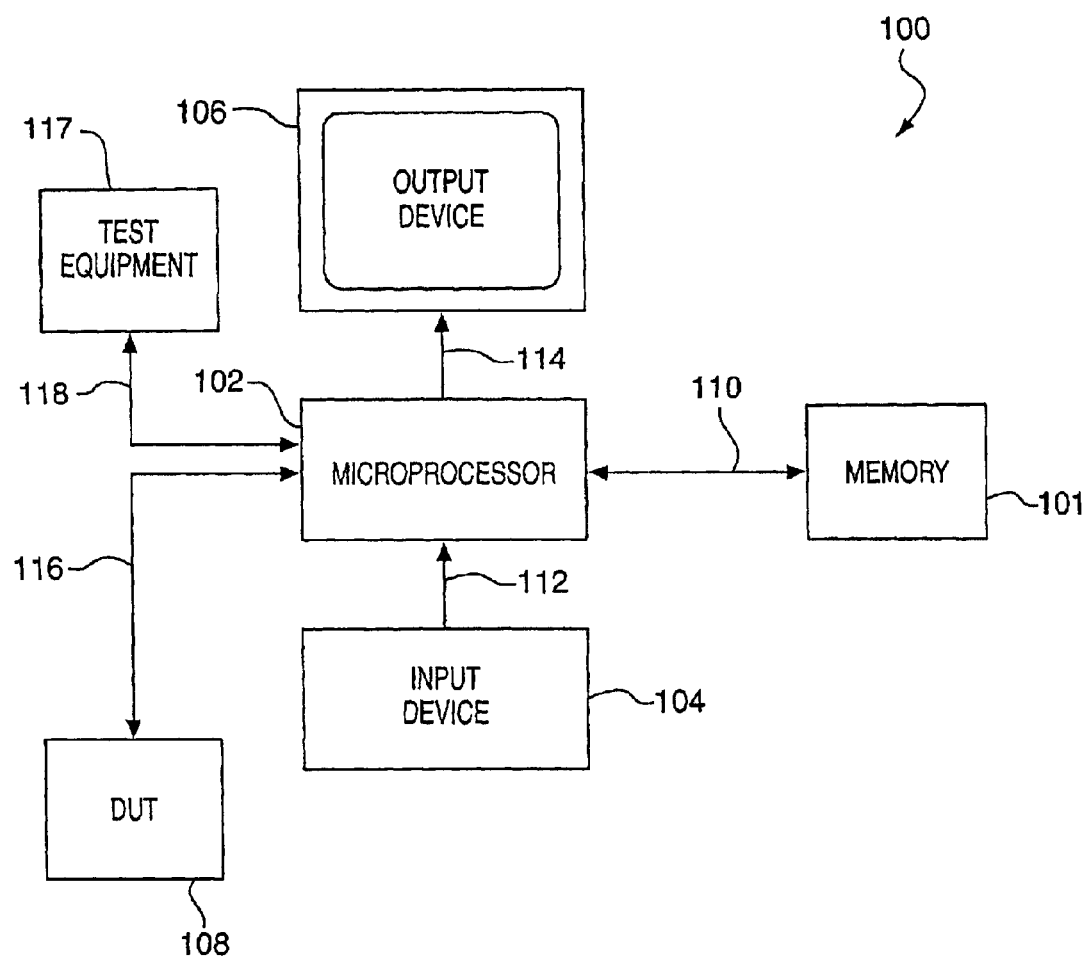
FIG. 1 is a block diagram showing the principal hardware components of the preferred embodiment of the present invention connected to a device under test.

The present invention relates to an electronic test system with a progress window that enables the user to observe in one glance the progress of the test. Referring to FIG. 1, in the preferred embodiment, the test system preferably comprises a computer 100. Computer system 100 includes a memory 101, a microprocessor 102, an input device 104, and an output device 106. Memory 101 communicates with microprocessor 102 via electrical line 110. Input device 104 communicates with microprocessor 102 through electrical line 112. Microprocessor 102 outputs the data through output device 106 via electrical line 114.

In another embodiment, the test system can take the form of software stored in memory 101 and run or executed by processor 102. The user interacts with the test system through input device 104 such as, but not limited to, a keyboard, a mouse, a track ball, a touch pad, and a joystick. The input device 104 allows moving a cursor or a pointer on the output device 106 (a display system such as a Cathode Ray Tube monitor or a Liquid Crystal Display). The results of the test are displayed on the output device 106. The test is controlled by processor 102, which communicates the instructions of the test program to the product under test or device under test (DUT) 108 via electrical line 116. Processor 102 controls the test equipment 117 via electrical line 118. The test results are processed by processor 102 and stored in memory 101 to be visualized by display 106. The display information contains both information as to the configuration and position of the cursor and other visual information of interest to the user such as the results of the test and how the test is progressing.

The invention may be implemented in a variety of actual electronic devices that follow the general form outlined on FIG. 1. For example, the test system may be embodied in a computer system or it may also be embodied in other hardware as a logic circuit, embodied as an electronic testing device such as, but not limited to, an electronic analyzer.

Figure 2:
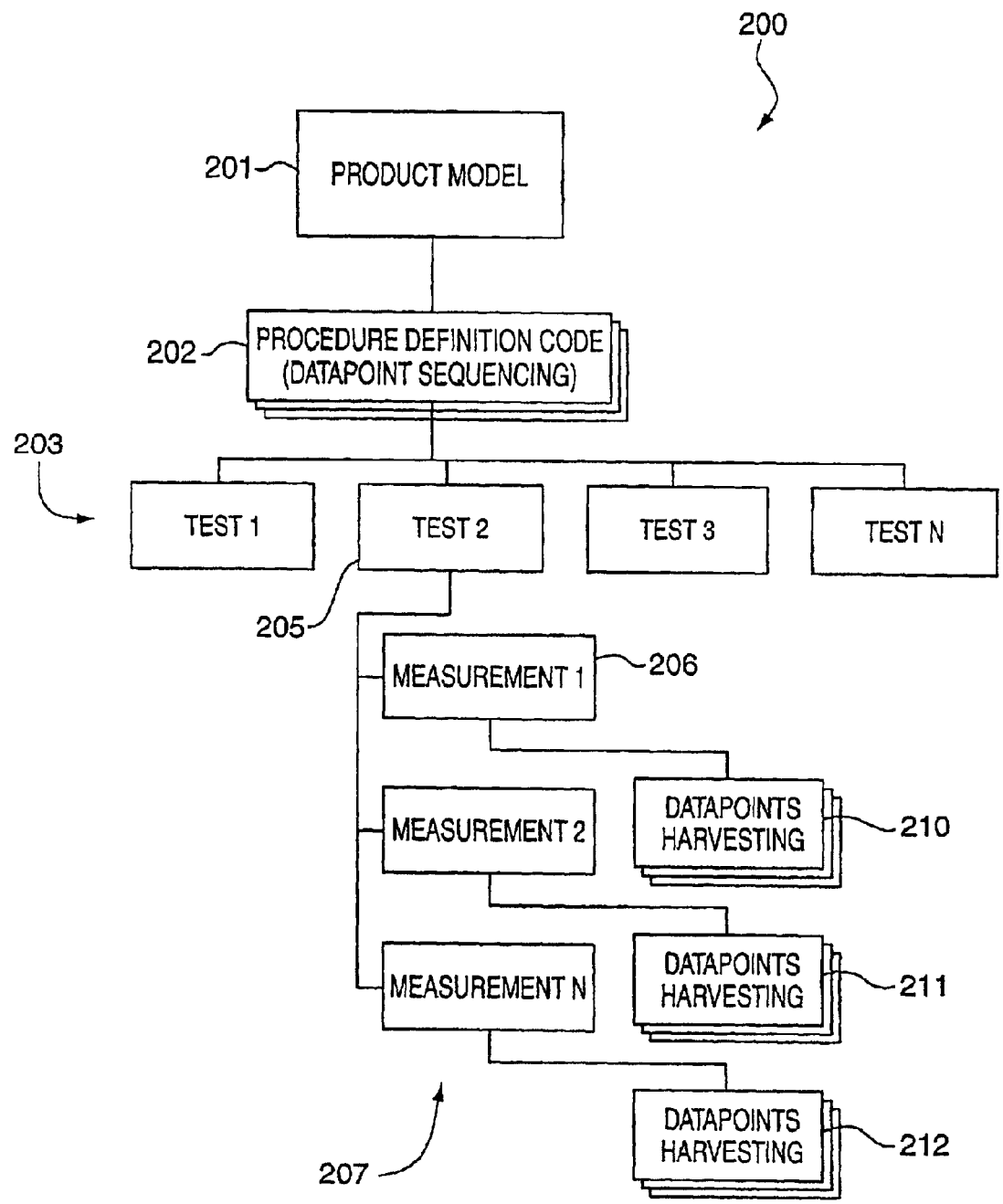
FIG. 2 is a block diagram showing the hierarchical structure of the preferred embodiment of a test program according to the invention.

To better understand the workings of the invention, it is helpful to describe the hierarchical structure of the preferred test program of the present invention, and the order in which the test is performed. Referring to FIG. 2, there is shown a block diagram 200 illustrating the hierarchical, i.e., multi-level, characteristic of the test program. The first level 201 corresponds to the product model, a file the test developer creates to test a family of specific device model numbers. It contains test procedures and inputs.

The next level 202 corresponds to the procedure itself. A procedure is an ordered list, sequence, or script of tests to be run. Several procedures may exist, which is represented in FIG. 2 by a deck of cards 202, each representing a different procedure. Each procedure includes a plurality of tests, i.e., test 1, test 2, test 3 . . . test N, as shown at 203. Each test includes a plurality of measurements. This is illustrated in FIG. 2 for test 2 shown at 205. As shown, test 205 includes measurements 207, i.e., measurement 1, measurement 2 . . . measurement N. Each measurement includes one or more datapoints, represented as a deck of cards 210, 211, 212, associated with each measurement. A procedure is defined by writing a program or a code to build a structure of software objects. In one embodiment, the software objects are Component Object Model (COM) objects. COM is a language independent component architecture, not a programming language. It is meant to be a general purpose, object-oriented means to encapsulate commonly used functions and services. See Newton's Telecom Dictionary by Harry Newton, Publishers Group West, page 197.

A test 205 is a group of measurements 207 in a procedure 202 that share the same test algorithm or the same test software code. Some examples of tests include amplitude accuracy test, test of harmonic distortion, etc. The test program repeatedly calls a test for each measurement and datapoint.

A measurement, such as measurement 206, is a configuration or a set up for a test. Each measurement, in measurements 207, within a test 205 can have different setups or configuration parameters. Tests are parameter driven and the parameters are inputs at the measurement level. Measurements are elements such as range in volts, frequency in kilohertz or harmonic (an integer number). The test procedure 202 views the measurements 207 as data to be passed from the procedure to a test. A measurement is also a phase of test execution. During the measurement phase of test execution, the measurement is started but data is not collected. This allows for multiple devices under test (DUTs) to be configured and triggered together.

A datapoint such as 210, 211, 212, is a subset of a measurement, such as 206, containing additional parameters that select a result when one measurement generates multiple results. Some examples of multiple datapoints for a measurement are the minimum and maximum of a spectrum analyzer sweep or each channel of a device.

For each datapoint, such as 210, in measurement 206, a value result is extracted. The results obtained are compared to specifications. Specifications are numerical limits, string match, or Boolean pass/fail. There are three sets of limits: marginal limits, line limits and customer limits. Each limit has an upper and a lower value.

Figure 3:
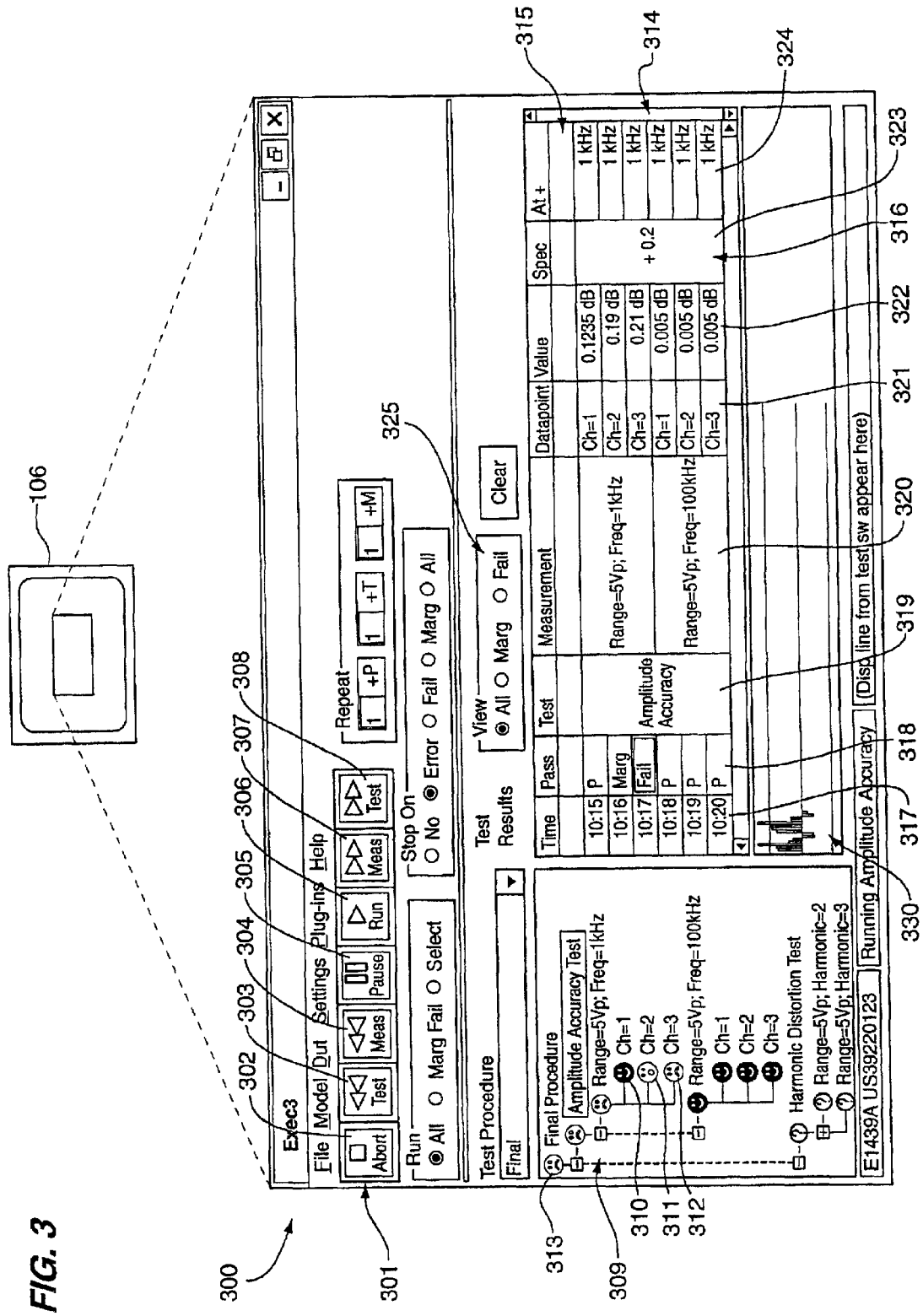
FIG. 3 shows a view of the graphical user interface of the electronic test system.

All the inputs and outputs of the electronic test system (FIG. 1) are handled preferably through a graphical user interface (GUI). FIG. 3 shows the graphical user interface 300 as displayed on the output device 106. The tape recorder buttons 301 on the top left are used to control the test. From left to right: abort 302, restart test 303, restart measurement 304, pause 305, run 306, skip measurement 307, skip test 308.

The bottom of the screen 309 shows a window describing the hierarchy of tests, measurements, and datapoints. Icons, such as 313, indicate pass, fail, marginal and not yet tested. A "smiling" 310, "surprised" 311, and "sad" 312 icon correspond respectively to pass, marginal and fail. The pass/fail icon 313 on top of the window is for the entire procedure. It summarizes the status of all the tests with the fail having priority. That is, if there is one fail test the whole procedure is fail. An algorithm that promotes the least optimal result is used to compute the final status of the procedure.

On the right side of the screen 300, a window 314 shows a series of rows 315 and columns 316 of alphanumeric test information. Window 314 displays the time the test is run, such as at 317, as well as the status of the test, such as at 318. Window 314 also displays the test that is being carried out, such as amplitude accuracy at 319, the type of measurement, such as (range=5 Vp, Frequency=1 kHz) at 320, the datapoint or channel under test, such as (Ch=1, Ch=2, Ch=3) at 321, the value or result of the measurement, such as (0.1235 dB) at 322, the specification, such as (±0.2) at 323, and the frequency, such as (1 kHz) at 324. The test can be sorted by clicking on the icon view 325 on top of the window 314. This function allows the test results to be filtered and displayed depending on their status.

Figure 4:
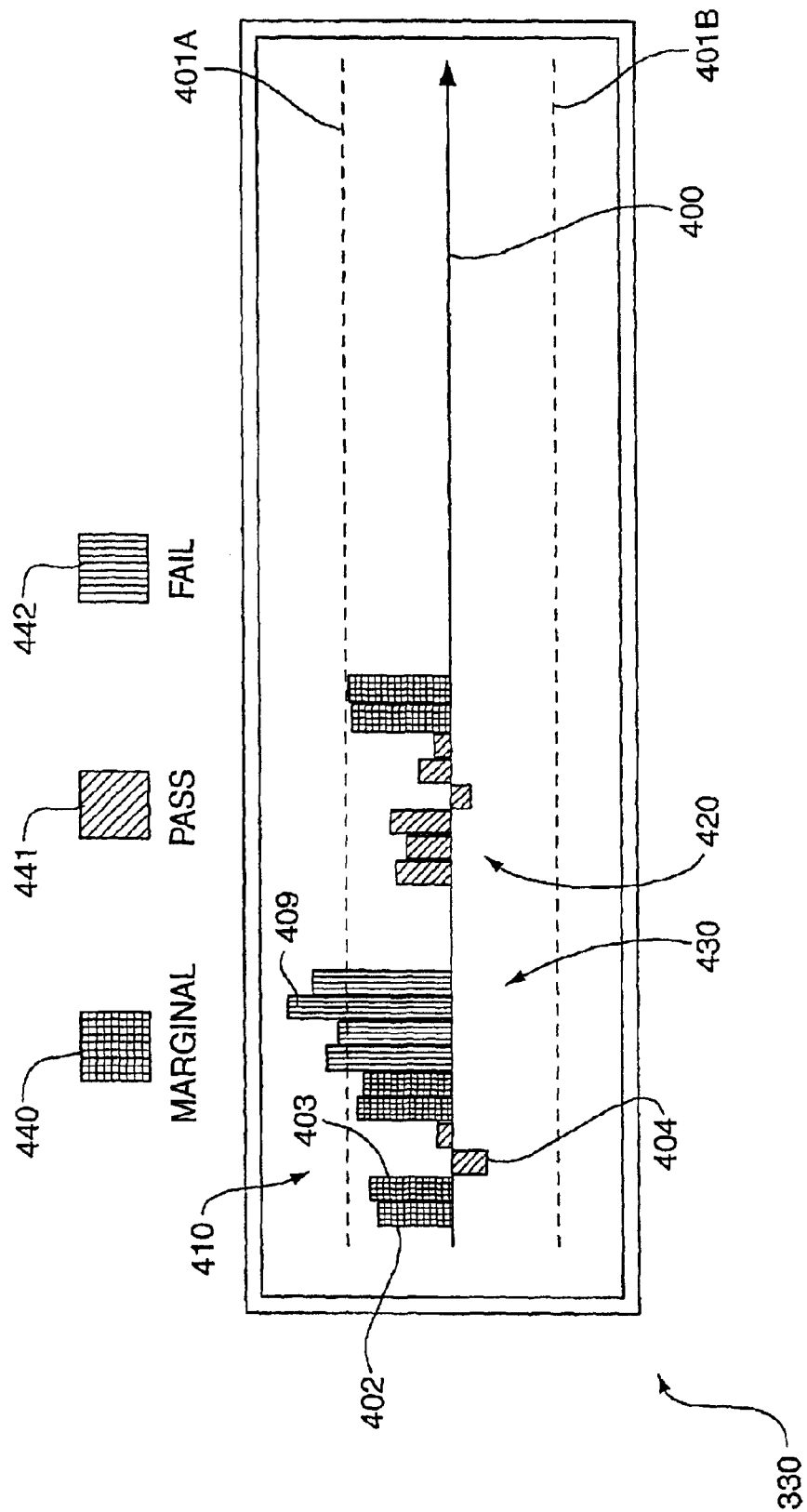
FIG. 4 shows a progress window according to the invention.

The bottom right window 330 represents the preferred embodiment of a progress window according to the invention. FIG. 4 shows an enlarged view of this window. Referring to FIG. 4, axis 400 represents the length of the entire procedure. Datapoints corresponding to the test results are preferably plotted as datapoint units 410 along a progress axis 400. Each datapoint unit 410 preferably is a single graphical element, such as 402, 403, 404, etc. Preferably, each graphical element comprises a bar. The length of each bar in the direction perpendicular to the progress axis 400 is normalized to "1". That is, the vertical length of the bar is proportional to the ratio of results numerical value to specification numerical value. The progress window 330 also preferably includes specification limit elements 401A and 401B. Preferably, the specification limit elements 401A and 401B comprise dotted horizontal lines 401A and 401B, with 401A indicating the upper limit and 401B indicating the lower limit. That is, the line 401A above the axis 400 corresponds to the upper specification limit and the line 401B below the axis 400 corresponds to the lower specification limit. Since the length of the bars are normalized, the specification lines 401A and 401B are preferably placed at a unit (1) distance above and below axis 400. Thus, if the bar representing the result is within specification, that is, its length is such that it is within the area defined by the specification limit lines, such as 404, the result is pass. If the bar representing the result is outside specification, that is, its length extends beyond the corresponding specification limit line, such as 409, the result is fail. If the bar representing the result is barely inside the specification limits, that is, its length is equal to or close to the corresponding specification limit line, such as 403, the result is marginal.

Preferably, each graphical element is also color coded to indicate the pass 404, fail 409 or marginal 403 status. For example, the color red is chosen for fail, the color green for pass and the color yellow for marginal. Preferably, the graphical elements are colored bars 402, 403, etc. Thus, each datapoint results in a colored vertical bar, such as 402, 403, etc. In FIG. 4, the graphical elements 410 are lined for color. As shown at 440, a hatched lining indicates a yellow color; as shown at 441, a diagonal lining indicates a green color; and, as shown at 442, a vertical lining indicates a red color. Though the bars are preferably color coded to indicate the status of the test measurements, the color code is not essential since the user can distinguish the status of each measurement by looking at the length of each bar relative to the specification lines. However, adding a color to the bar facilitates the determination of the status of each test result.

Figure 5:
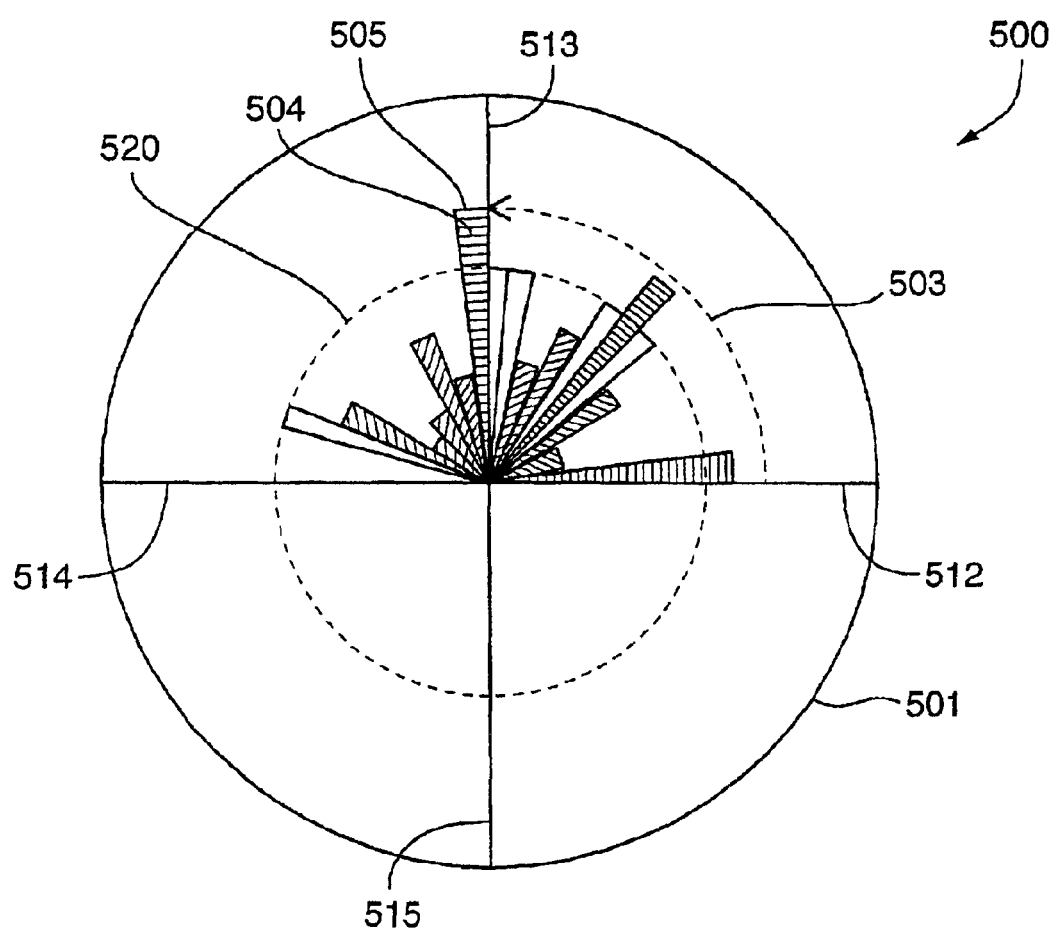
FIG. 5 shows an alternative embodiment of a progress window according to the invention.

An alternative embodiment of the progress window 500, according to the invention, is shown in FIG. 5. Referring to FIG. 5, the progress window is comprised of graphical elements, such as 504. The graphical elements are grouped in a circle 501 using radial coordinates. The radius, such as 505, for each element, such as 504, corresponds to the numerical value of the result, and the angle, such as 503, conveys the time at which the result was measured. Each datapoint results in a sector, such as 504, wherein the radius of that sector is proportional to the ratio of results numerical value to specification numerical value. The specification limit 520 is preferably plotted as a dotted circle inside circle 501 defining the progress window. The sectors, corresponding to the datapoints or results, are preferably color coded or design coded to show the pass, fail and marginal status of each result. Again, the graphical elements, such as 505, are lined for color and a reference chart 530 is provided in the figure to explain the lining. The color or the design feature is only intended as a visual tool to help the user distinguish the status of each test result since the user can determine the status of each result by observing if the sector is inside, barely inside or outside specification circle 520. However, each sector, corresponding to the value result, is preferably assigned a color or a design according to the length of its radius by applying a mathematical criterion. For example, if the radius of the sector corresponding to the datapoint is greater than the radius of the circle corresponding to the specification, the sector is assigned a design or color so as to display that the result is "fail". If the radius of the sector corresponding to the datapoint is less than the radius of the circle corresponding to the specification, the sector is assigned a design or color so as to display that the result is "pass". If the radius of the sector corresponding to the datapoint is equal or very close to the radius of the circle corresponding to the specification, the sector is assigned a design or color so as to display that the result is "marginal".

The progress window 500 not only allows the user to distinguish between possible outcomes of test results; it also permits the user to check the time left to accomplish the test procedure by observing how much of the area inside the circle 501 is covered by the sectors corresponding to the results. The window 500 also includes a start line 512 and progress lines 513, 514, and 515 which divide the window into quadrants to assist in quickly showing how much of the test is completed.

Figure 6:
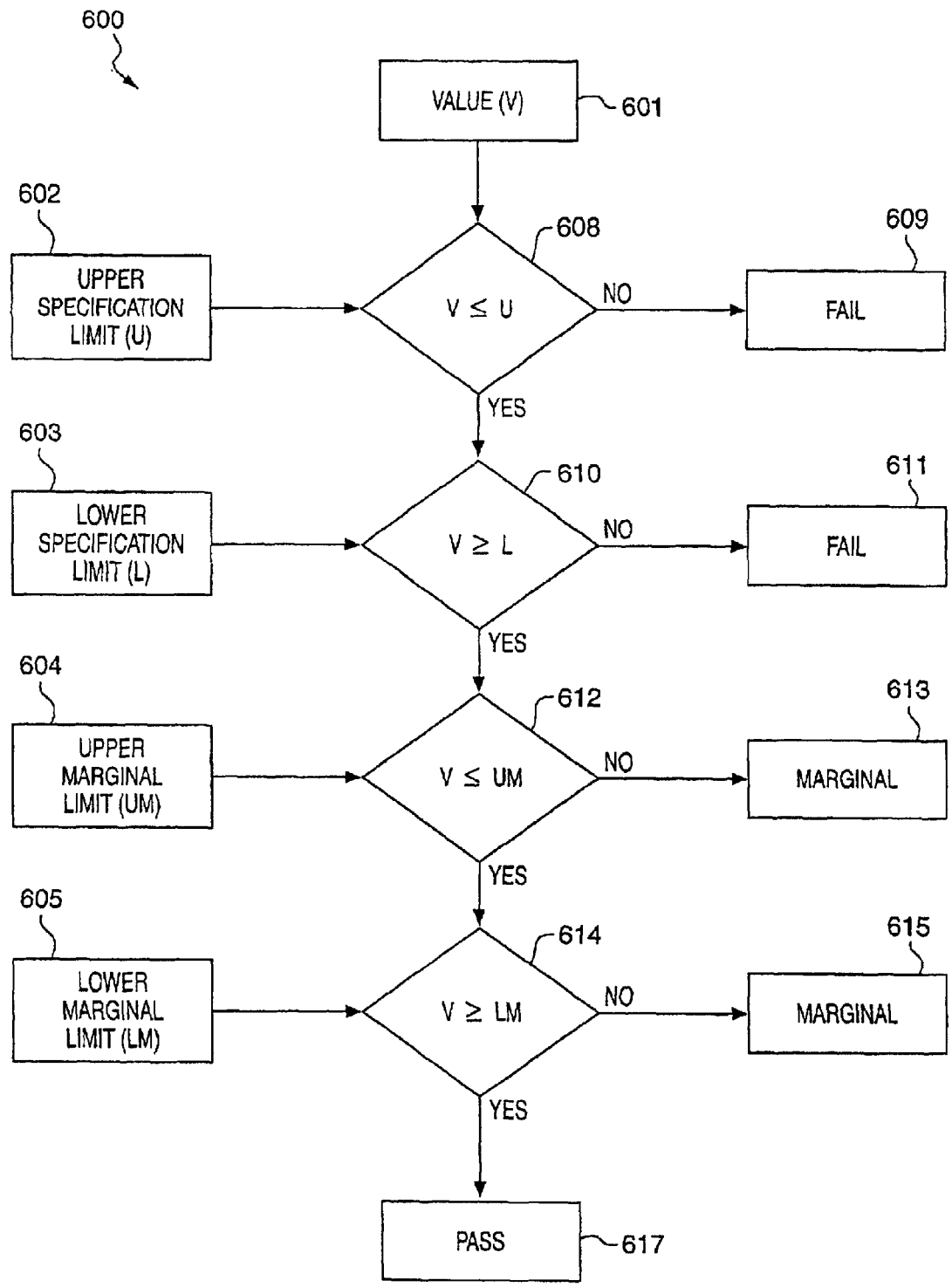
FIG. 6 shows a flow chart illustrating the determination of the pass, fail, or marginal status for each graphical element for a single-sided specification.

Referring to FIG. 6, there is shown a flow chart 600 illustrating the determination of the status of a result and the normalization process. The inputs used to determine the status include the value (V) 601 for the result, the upper specification limit (U) 602, the lower specification limit (L) 603, the upper marginal limit (UM) 604, and the lower marginal limit (LM) 605. The value (V), which is determined by the test measurement, and the limits U, L, UM, and LM, which are entered by the user, are stored in memory 101 (FIG. 1). In step 608, the test system 100 determines if V is less than or equal to U. If it is not, then the system assigns a fail status to the result at step 609. If it is, the system goes to step 610 and determines if V is greater than or equal to L. If it is not, the system assigns a fail status to the result at step 611. If it is, the system proceeds to step 612, where it determines if V is less than or equal to UM. If it is not, the system assigns a marginal status to the result in step 613. If it is, the system proceeds to step 614, where the system determines if V is greater than or equal to LM. If it is not, in step 615, the system assigns a marginal status to the result. If it is, the system proceeds to step 617 and assigns a pass status to the result.

The ability for the user to distinguish easily in one glance at the progress bar if the test is pass, fail or marginal is a feature of the invention. All the information on the test results is available on one window. The user may take immediate action as to whether to let the test progress or terminate the test and modify some of the parameters.

For instance, if a series of fails are observed, that is, if too many red bars are seen on the progress bar such as in situation 430 in FIG. 4, the user may take action and stop the test. If there are only a few marginal results with most of the results being pass, that is, green bars are in the majority, such as in situation 420 on FIG. 4, the user may decide to let the test continue.

There has been described what at present is considered to be the preferred embodiment of the invention. It will be understood that the invention can be embodied in other specific forms without departing from its spirit or essential characteristics. For example, while the invention has been described in terms of an electronic test program, other systems may be implemented based on hardware instead of software. The program may, for instance, sit on a programmed processor or other platform. In addition, more than one progress window may be added to the graphical user interface to display the test results of two or more devices under test. The progress window may be displayed in other forms where the graphical elements may take a different form, such as a single alphanumeric element, or may be grouped in a different manner. The present embodiment is, therefore, to be considered as illustrative and not restrictive. The scope of the invention is indicated by the appended claims.

I claim:

1. An electronic test system comprising:
   a memory for storing a test procedure including a plurality of measurements; and a plurality of datapoints corresponding to test results for said plurality of measurements;
   an electronic processor communicating with said memory for controlling the execution of said procedure and displaying said test data; and
   a graphical user interface output device communicating with said electronic processor for displaying information, said information including a plurality of datapoint units, each datapoint unit consisting of a single graphical element having at least two dimensions and conveying the results of said test for a corresponding datapoint, said datapoint units grouped in a manner to display the progress of said test procedure.

2. An electronic test system as in claim 1 wherein said graphical elements are grouped along a progress axis, and the distance said elements extend along said progress axis represents the length of said test procedure.

3. An electronic test system as in claim 1 wherein said graphical elements each comprise a bar.

4. An electronic test system as in claim 3 wherein said graphical elements are plotted as colored bars perpendicular to said progress axis.

5. An electronic test system as in claim 3 wherein said memory further stores a specification limit for each of said datapoints and a value for each of said test results, and each of said graphical bars have a length proportional to the ratio of the value of said result, corresponding to said graphical bar, to said specification limit for said datapoint.

6. An electronic test system as in claim 5 wherein said memory further stores upper and lower specification limits for each of said measurements and said information further comprises a first specification limit element representing said upper specification limit and a second specification limit element representing said lower specification limit.

7. An electronic test system as in claim 6 wherein said upper and lower specification limit elements are graphical lines.

8. An electronic test system as in claim 7 wherein said graphical elements are grouped along a progress axis, said upper specification limit is a line positioned above and parallel to said progress axis, and said lower specification limit is a line positioned below and parallel to said progress axis.

9. An electronic test system as in claim 3 wherein the length of said graphical bar perpendicular to said progress axis is normalized to said specification.

10. An electronic test system as in claim 9 wherein the length value of said normalized graphical bar is compared to 1 so as to indicate the status of said result.

11. An electronic test system as in claim 10 wherein said status is selected from the group consisting of pass, fail and marginal.

12. An electronic test system as in claim 1 wherein said graphical elements are color coded.

13. An electronic test system as in claim 12 wherein said color code indicates a status selected from the group comprising pass, fail and marginal.

14. An electronic test system as in claim 13 wherein said color code comprises three colors, each said color corresponding to one of said pass, fail and marginal statuses.

15. An electronic test system as in claim 14 wherein each of said graphical elements is a bar, and said color is assigned to each of said bars according to its length.

16. An electronic test system as in claim 1 wherein said procedure comprises a plurality of measurements to be applied to a product selected from the group consisting of electronic, electromechanical and mechanical products.

17. An electronic test system as in claim 1 wherein said memory stores instructions for communicating with said electronic, electromechanical and mechanical products.

18. A method for displaying the results of an electronic test comprising the steps of:
performing a test procedure comprising a plurality of test measurements to determine a plurality of datapoints, each said datapoint corresponding to the result of one of said test measurements;
displaying a plurality of graphical units, each said graphical unit representing one of said datapoints, each of said graphical units comprising a single graphical element having at least two dimensions; and
grouping said graphical elements in a manner to display the progress of said test procedure.

19. A method as in claim 18 wherein said step of displaying comprises displaying a plurality of graphical bars, each of said graphical bars corresponding to one of said graphical elements.

20. A method as in claim 18 wherein said step of grouping comprises plotting said graphical elements along a progress axis representing the length of said test procedure.

21. A method as in claim 18 wherein said step of displaying comprises plotting the graphical elements as colored elements.

22. A method as in claim 18, further including the step of storing a numerical value and a specification limit value for each of said datapoints.

23. A method as in claim 18 wherein said step of displaying further comprises displaying said specification limit value.

24. A method as in claim 23 wherein said step of displaying said specification limit value comprises plotting said specification limit value as a line.

25. A method as in claim 24 wherein said step of plotting comprises plotting said graphical elements along a progress axis representing the length of said test procedure, plotting an upper specification limit as a line above and parallel to said progress axis, and plotting said lower specification limit as a line below and parallel to said progress axis.

26. A method as in claim 18, and further including the step of normalizing each of said graphical elements.

27. A method as in claim 26, and further including the step of storing a specification limit for each of said datapoints, and said step of normalizing comprises dividing the value of each of said datapoints by the corresponding specification limit.

28. A method as in claim 27 wherein said wherein said step of displaying comprises plotting each of said graphical elements as a graphical element having a length determined by said step of normalizing.

29. A method as in claim 28 wherein said step of displaying comprises plotting said graphical elements along a progress axis representing the length of said test procedure and plotting said graphical elements in a direction perpendicular to said progress axis.

30. A method as in claim 27 wherein said step of storing comprises storing an upper specification limit and a lower specification limit for each of said datapoints, and said step of normalizing comprises normalizing said value of said datapoint for both said upper specification limit and said lower specification limit.

31. A method as in claim 28 wherein said step of displaying comprises plotting said graphical elements along a circular coordinate representing the length of said test procedure and plotting said graphical elements in a radial direction.

32. A method as in claim 18 wherein said step of displaying comprises displaying said graphical element in color so as to convey the pass, fail and marginal status of said datapoint.

33. A method as in claim 32 wherein said step of displaying further comprises assigning a green color for a bar corresponding to a pass status, assigning a yellow color for a bar corresponding to a marginal status, and assigning a red color for a bar corresponding to a fail status.

* * * * *